(12) United States Patent  (10) Patent No.: US 7,563,700 B2
Srivastava et al.  (45) Date of Patent: Jul. 21, 2009

(54) METHOD FOR IMPROVING SELF-ALIGNED SILICIDE EXTENDIBILITY WITH SPACER RECESS USING AN AGGREGATED SPACER RECESS ETCH (ASRE) INTEGRATION

(75) Inventors: Anadi Srivastava, Austin, TX (US); Mark D. Hall, Austin, TX (US); Raghaw S. Rai, Austin, TX (US); Jesse Yanez, New Braunfels, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 532 days.

(21) Appl. No.: 11/360,897

(22) Filed: Feb. 22, 2006

(65) Prior Publication Data

US 2007/0197009 A1 Aug. 23, 2007

(51) Int. Cl.
*H01L 21/3205* (2006.01)
*H01L 21/4763* (2006.01)
(52) U.S. Cl. .............................. 438/592; 257/E21.439
(58) Field of Classification Search ................ 438/592, 438/581, 583, 630, 651; 257/21.439
See application file for complete search history.

(56) References Cited

U.S. PATENT DOCUMENTS

| 5,196,360 | A | * | 3/1993 | Doan et al. ................. 438/586 |
| 6,048,784 | A | * | 4/2000 | Hong et al. ................. 438/592 |
| 6,169,017 | B1 | | 1/2001 | Lee |
| 6,461,951 | B1 | | 10/2002 | Besser et al. |
| 6,509,264 | B1 | | 1/2003 | Li et al. |
| 6,746,927 | B2 | | 6/2004 | Kammler et al. |

\* cited by examiner

*Primary Examiner*—Lex Malsawma
(74) *Attorney, Agent, or Firm*—John A. Fortkort; Fortkort & Houston PC

(57) ABSTRACT

A method is provided for making a silicided gate (209). In accordance with the method, a semiconductor structure (201) is provided which comprises a semiconductor substrate (202), a gate (209) disposed on the semiconductor substrate, and a spacer (219) adjacent to the gate. The structure is subjected to a first etch which exposes a first lateral portion of the gate. An implant (215) is then created in a region adjacent to the spacer. The structure is then subjected to a second etch which exposes a second lateral portion of the gate electrode, and a layer of silicide (225) is formed which extends over the first and second lateral portions of the gate.

21 Claims, 5 Drawing Sheets

METHOD FOR IMPROVING SELF-ALIGNED SILICIDE EXTENDIBILITY WITH SPACER RECESS USING AN AGGREGATED SPACER RECESS ETCH (ASRE) INTEGRATION

FIELD OF THE DISCLOSURE

The present disclosure relates generally to semiconductor devices, and more particularly to methods for forming silicide layers in semiconductor devices.

BACKGROUND OF THE DISCLOSURE

Various metal silicides, such as cobalt silicide, are used in the art as contact materials for forming contacts to silicon in CMOS devices. The use of metal silicides is desirable due to the low resistivity, high stability, and small lattice mismatch with silicon that is achievable with these materials. Moreover, as compared to many other contact materials, metal silicides can be readily patterned into relatively small dimensions.

Unfortunately, the ongoing trend toward smaller device sizes in semiconductor fabrication processes is currently testing the limitations of silicide technology. In particular, as polysilicon gate lengths decrease, it becomes increasingly challenging to form uniform layers of silicide on these gates. Indeed, at dimensions below about 50 nm, extensive voiding and silicide spiking can occur during silicide formation. Consequently, at these dimensions, uniform silicide films cannot be formed in a reproducible manner using current technologies.

Some attempts have been made in the art to overcome this problem. For example, in some applications, overetching of spacer structures has been employed to expose additional surface area on the gate. This technique permits the formation of more uniform silicide films on gate structures of smaller gate lengths, since it increases the total surface area available for the formation of the silicide film. However, the reductions in gate lengths achievable with this technique have been found to be incremental at best, since the electrical properties of the resulting structures are found to degrade rapidly as the extent of overetching increases.

There is thus a need in the art for a method for forming silicided polysilicon gates in semiconductor devices which overcomes the aforementioned infirmity. In particular, there is a need in the art for a method for reproducibly forming silicided polysilicon gates in which the gates have reduced dimensions, without adversely affecting the electrical properties of the semiconductor device. These and other needs may be met by the devices and methodologies described herein.

DETAILED DESCRIPTION

Figure 1:
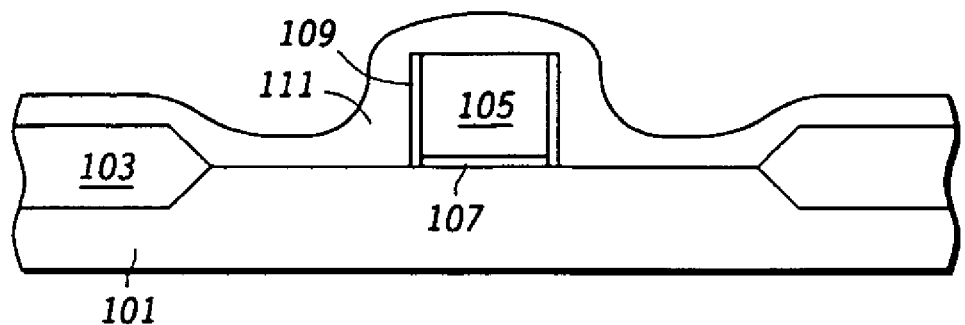
FIG. 1 is an illustration of a semiconductor structure during a step of a prior art process.

In one aspect, a method is provided herein for making a silicided gate. In accordance with the method, a semiconductor structure is provided which comprises a semiconductor substrate, a gate disposed on the semiconductor substrate, and a spacer adjacent to the gate. The structure is subjected to a first etch which exposes a first lateral portion of the gate. An implant region is then created in a portion of the substrate adjacent to the spacer. The structure is then subjected to a second etch which exposes a second lateral portion of the gate, and the first and second lateral portions of the gate are silicided.

These and other aspects of the present disclosure are described in greater detail below.

It has now been found that the aforementioned needs in the art may be met by utilizing multiple recess etches to expose additional surface area of the gate for silicidation during the fabrication of transistors and other semiconductor devices that are equipped with spacers. In particular, a first etch may be utilized to expose a first lateral portion of the gate, while maintaining the widths of the spacers within a range suitable for definition of the implant regions subsequently used to define the source and drain regions of the device. After these implant regions are defined, one or more additional recess etches may then be used to expose additional lateral portions of the gate until the total exposed surface area of the gate has reached a desired value.

The methodologies described herein allow the location of the implant regions in the device to be decoupled from the total lateral surface area of the gate that is exposed by recess etching, and also allows the location of the implant regions in the device to be decoupled from the final dimensions of the spacers. Consequently, the surface area of the gate that is exposed for silicidation can be maximized, without adversely affecting leakage current and other electrical characteristics of the device. This surface area maximization has the benefit of helping to overcome the aforementioned problems with voiding in the silicide layer. As further advantages, the methodologies described herein can provide reduced polysilicon line resistance, increased device speeds, and relaxed polysilicon-to-contact overlay requirements, and also combine the need for reduced gate dimensions with a gate surface area that is sufficiently large to permit uniform layers of silicide to be formed on the gate in a reproducible manner.

The methodologies described herein can be better understood in the context of the prior art process described in FIGS. 1-5. In the process depicted therein, a semiconductor device is formed on a silicon substrate 101. The device is isolated from other semiconductor devices formed on the substrate 101 by field oxide shallow trench isolation areas 103. A polysilicon gate 105 is formed on a gate oxide layer 107. A lightly doped drain implant (LDD) oxide 109 is disposed on the sidewalls of the gate 105. A pair of shallow implant regions 115 are then created in a portion of the substrate 101 adjacent to the LDD oxide layer 109 on each side of the gate 105.

Figure 2:
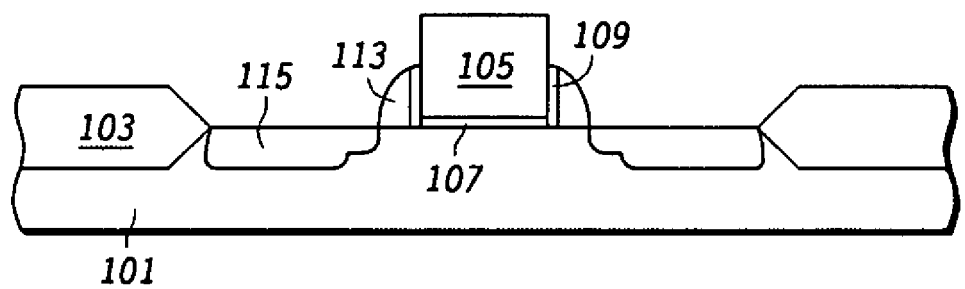
FIG. 2 is an illustration of a semiconductor structure during a step of a prior art process.

A layer of spacer material 111, such as silicon oxide or silicon nitride, is deposited conformally over the structure. The layer of spacer material 111 is then etched with a suitable etchant to define spacer structures 113 therein as shown in FIG. 2. However, in contrast to conventional etching techniques which are geared toward a structure in which the spacers 113 completely cover the gate sidewalls, the spacer material layer 111 is deliberately overetched to expose a portion of the sidewall of the gate 105. The overetch also removes any exposed portions of the LDD oxide 109. Once the spacers 113 are formed, deep implant regions 121 are created in the substrate by implantation. The structure may then be heated to activate the dopants in the deep implant regions 121.

Figure 3:
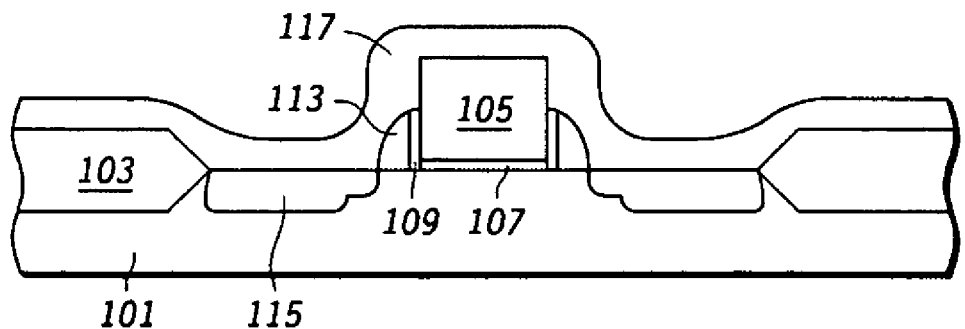
FIG. 3 is an illustration of a semiconductor structure during a step of a prior art process.

As shown in FIG. 3, a refractory metal layer 117 is then conformally deposited over the semiconductor wafer. Due to the overetching performed in the previous step, the refractory metal layer 117 comes into contact with the exposed portion of the sidewalls of the gate 105. When the semiconductor wafer is subjected to one or more heating steps, as through a rapid thermal anneal (RTA) process, a low resistivity silicide is formed in those areas where the refractory metal layer 117 has come into contact with either the polysilicon of the gate 105 or the silicon of the deep implant regions 121.

Figure 4:
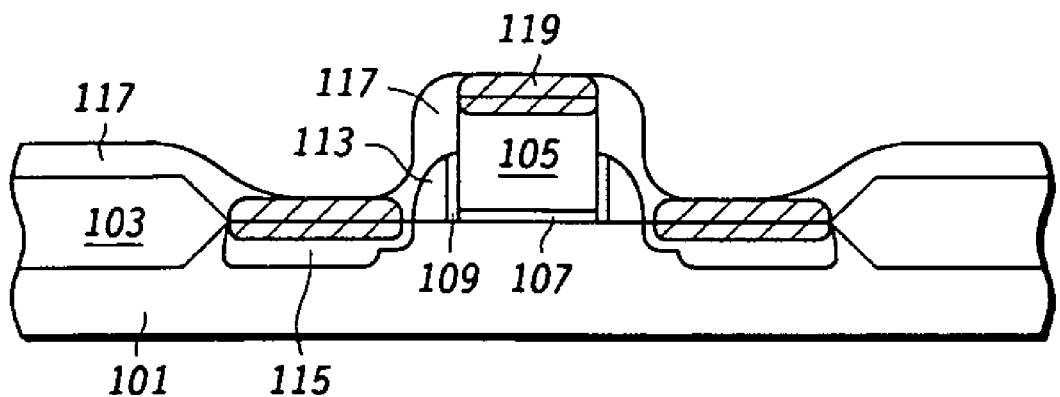
FIG. 4 is an illustration of a semiconductor structure during a step of a prior art process.

The resulting structure is depicted in FIG. 4 following the rapid thermal annealing steps utilized to form silicide regions 119 on the deep implant regions 121 and the gate 105. The silicide region 119 on the gate 105 extends to, and overhangs, the sidewalls of the gate 105. By contrast, silicide is not formed on the spacers 113 or the field oxide regions 103. Any unreacted metal is then removed by a suitable wet etch chemistry to achieve the structure depicted in FIG. 5. A second RTA may be performed to form the low resistivity silicide (such as, for example, $CoSi_2$, $TiSi_2$, or NiSi).

Figure 5:
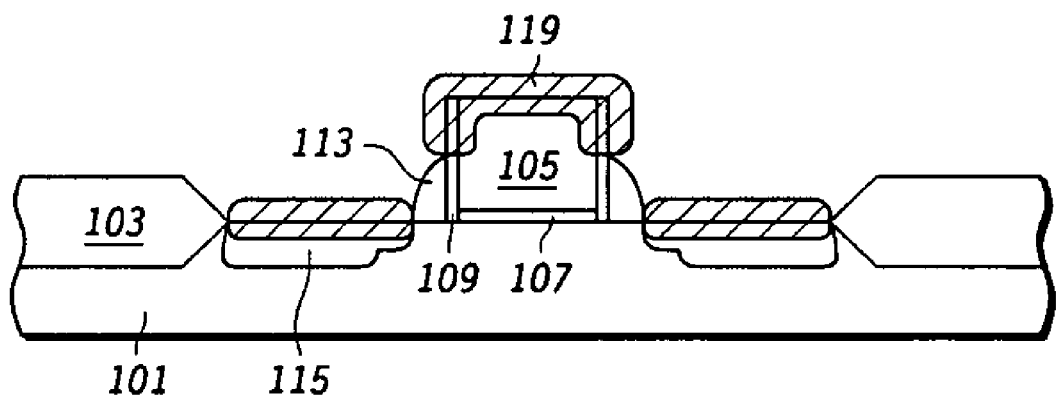
FIG. 5 is an illustration of a semiconductor structure during a step of a prior art process.

As will be appreciated from FIG. 5, the process described in FIGS. 1-5 is advantageous in that the overetch procedure described therein results in an increased gate surface area over which silicide can be formed, without any increase in the gate length. However, this process is inherently limited by the fact that the overetch process also defines the location of the deep implant regions 121. Consequently, as the extent of the overetch increases, the width of the spacers 113 decreases, and the separation between the deep implant regions 121 and the gate 105 becomes smaller. Beyond a relatively minimal amount of overetching, this is found to result in current leakage and other problems that degrade the electrical performance of the device. On the other hand, if the extent of the overetch is limited to avoid this problem, the additional surface area of the gate that is available for silicication is also limited, and hence the reduction in gate length achievable with the process is minimal.

Figure 6:
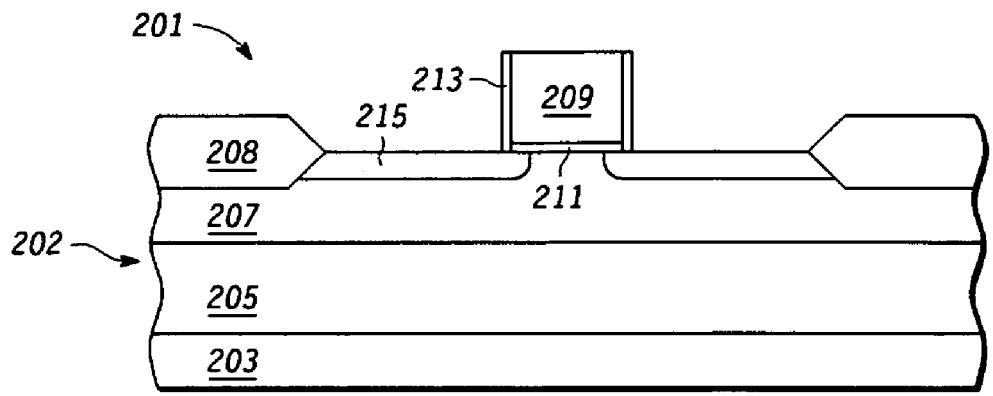
FIG. 6 is an illustration of a semiconductor structure during a step of a process in accordance with the teachings herein.

These shortcomings are addressed by the methodologies disclosed herein, which may be appreciated with respect to the first non-limiting embodiment disclosed in FIGS. 6-12. As shown in FIG. 6, a semiconductor structure 201 is provided which comprises a wafer 203, a buried oxide layer 205 and an active layer 207 (referred to collectively in this example as substrate 202). Hence, substrate 202 is a semiconductor-on-insulator (SOI) wafer. It will be appreciated, of course, that in possible variations of this embodiment, bulk wafers and other types of substrates could be used instead.

A series of field oxide regions 208 are provided to electronically isolate the individual devices that are created on the substrate 202. A gate 209 is disposed on the active layer 207 and is separated therefrom by a gate oxide layer 211. A second oxide layer 213, which may be, for example, a lightly doped drain implant (LDD) oxide, is disposed on the sides of the gate 209. A pair of shallow implant regions 215 are present in the active layer 207 on each side of the gate. Such implant regions may be created by a suitable ion implantation process or an appropriate sequence of ion implantation processes, followed by a thermal anneal to cause the diffusion of the implant regions 215. Since the diffusion is somewhat isotropic, this also has the effect of causing the implant regions 215 to extend slightly underneath the gate 209.

Figure 7:
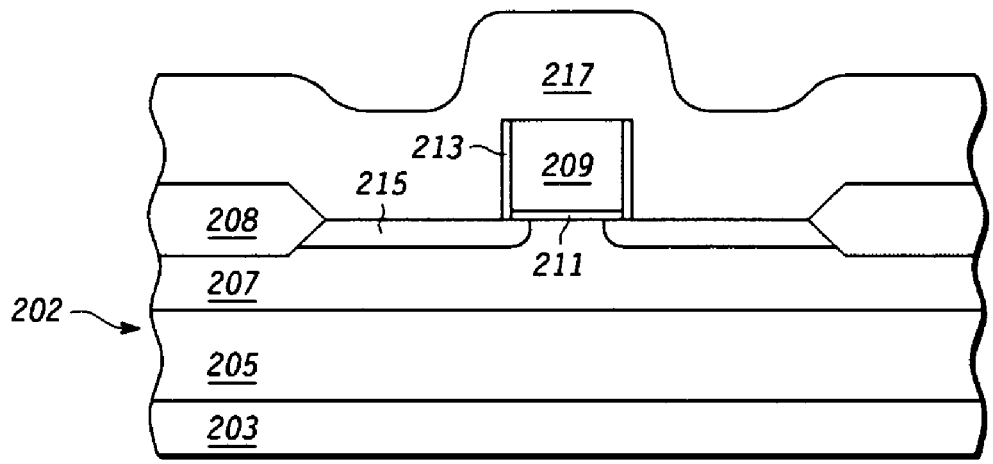
FIG. 7 is an illustration of a semiconductor structure during a step of a process in accordance with the teachings herein.
Figure 8:
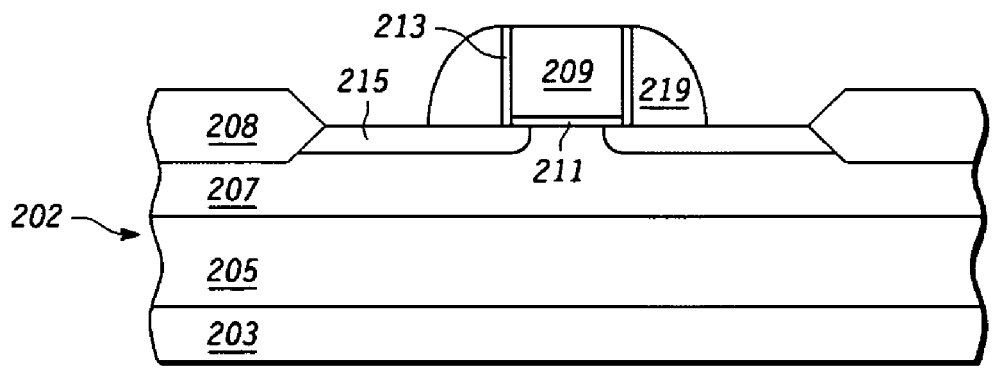
FIG. 8 is an illustration of a semiconductor structure during a step of a process in accordance with the teachings herein.

As shown in FIG. 7, a layer of a suitable spacer material 217 is disposed over the structure. The spacer material 217 is then anisotropically etched to produce a pair of spacer structures 219 adjacent to the gate 209 as shown in FIG. 8. Various spacer materials and etchants are known to the art, and the exact choice of spacer material and etchant (or etchants) will typically be dictated by the particular semiconductor device being formed, the intended use of the device, and the process parameters used to fabricate the device.

Figure 9:
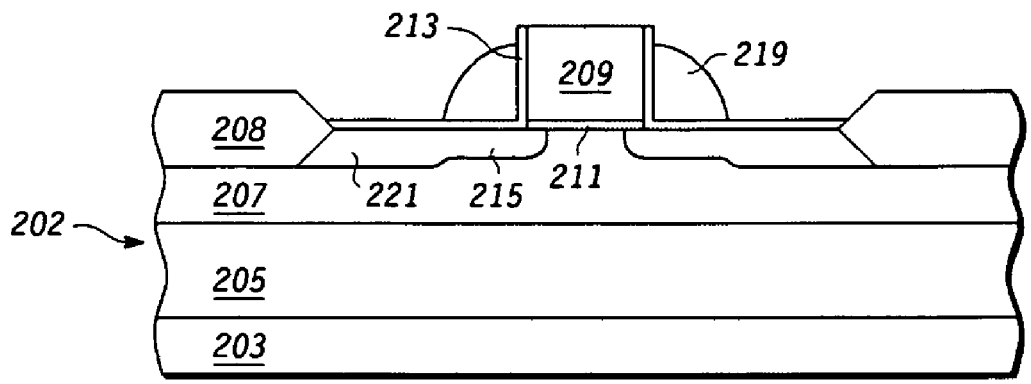
FIG. 9 is an illustration of a semiconductor structure during a step of a process in accordance with the teachings herein.

As depicted in FIG. 9, the spacer structures 219 are then subjected to a first (preferably anisotropic) recess etch which reduces the height of the spacer structures 219 to below the height of the gate 209. The structure is then subjected to a second ion implantation step to create second (deep) implant regions 221 which are aligned to the edges of the spacer structures 219 as defined by the first recess etch. The second implant regions 221 are then subjected to a thermal anneal to cause them to diffuse deeper into the active layer 207. Again, the diffusion is somewhat isotropic, so this process also has the effect of causing the second implant regions 221 to extend slightly underneath the spacer structures 219.

Figure 10:
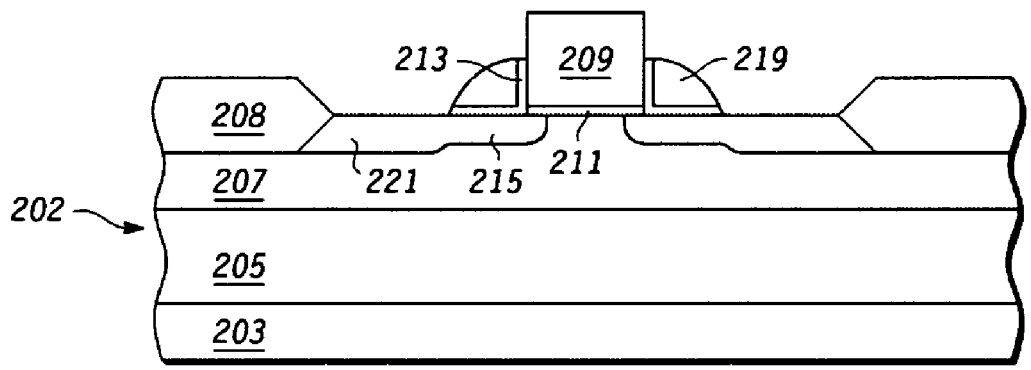
FIG. 10 is an illustration of a semiconductor structure during a step of a process in accordance with the teachings herein.

As shown in FIG. 10, the spacer structures 219 are then subjected to a second recess etch which further reduces the height of the spacer structures 219. The second recess etch is also selected to remove the exposed portion of the second oxide layer 213. Notably, since the second implant regions 221 are already defined, the second recess etch has the effect of exposing a larger surface area of the gate 209 to silicication, without modifying the placement of the second implant regions 221 and thereby adversely affecting the electrical properties of the device. Hence, the final spacer dimensions are effectively decoupled from the definition of the implant regions that form the source and drain regions of the device.

Figure 11:
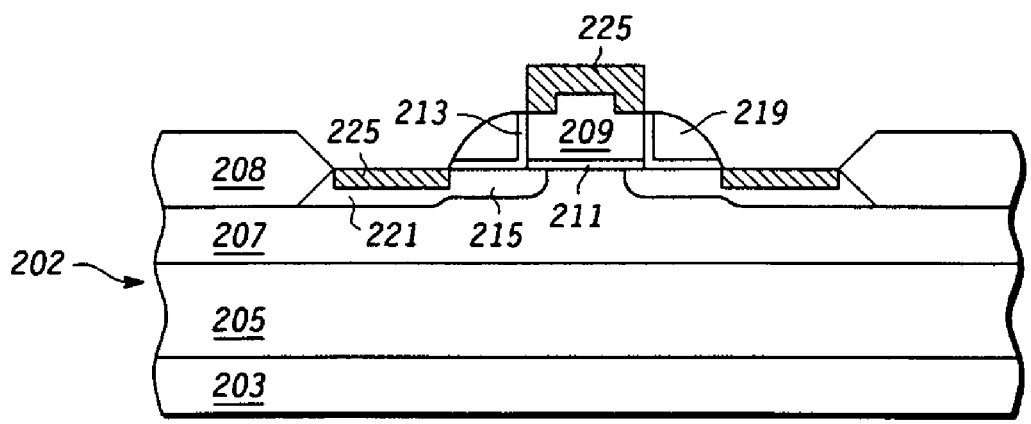
FIG. 11 is an illustration of a semiconductor structure during a step of a process in accordance with the teachings herein.

A refractory metal layer 225, which may comprise metals such as Co, Ti, Ni, NiSi, TiN or various combinations or alloys of the foregoing, is then conformally deposited over the structure. Due to the recess etches of the previous steps, the refractory metal layer 225 comes into contact with both the top and exposed side portions of the gate 209. When the structure is subjected to one or more heating steps, such as a rapid thermal anneal (RTA) process, a low resistivity silicide is formed in those areas where the refractory metal layer 225 is in contact with the material (preferably polysilicon) of the gate 209 or the material (preferably silicon) of the active layer 207, as shown in FIG. 11. The rapid thermal annealing may be performed at conventional temperatures and processing conditions.

As can be appreciated from FIG. 11, the silicide region 225 on the gate 209 extends to, and overhangs, the sidewalls of the gate 209. Silicide is not formed on the spacers 219 or the field oxide regions 208. The unreacted metal is then removed by a suitable wet etch chemistry. In some embodiments, a second RTA may be performed to form the low resistivity silicide ($CoSi_2$, $TiSi_2$, NiSi).

Figure 12:
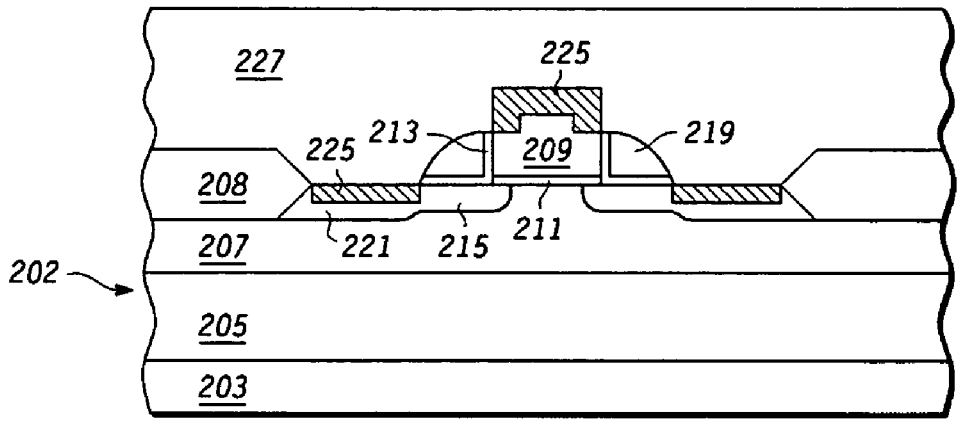
FIG. 12 is an illustration of a semiconductor structure during a step of a process in accordance with the teachings herein.
Figure 13:
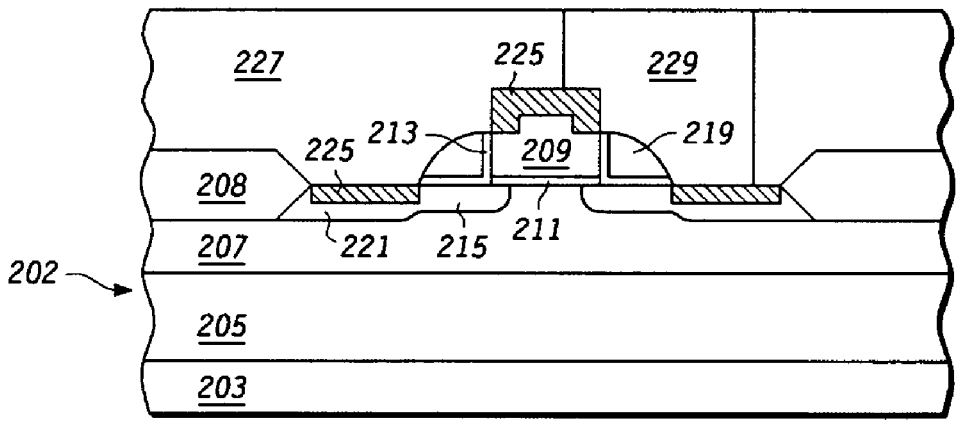
FIG. 13 is an illustration of a semiconductor structure during a step of a process in accordance with the teachings herein.

Once the silicide regions 225 are formed, the formation of the local interconnect or contact is then performed. This involves the deposition of an interlayer dielectric 227 as shown in FIG. 12. The interlayer dielectric 227 may be, for example, silicon dioxide derived from TEOS. Following the deposition of the dielectric layer, as shown in FIG. 13, an opening 229 is then formed in the interlayer dielectric 227 by an etch that is highly selective to the silicide 225 so that it does not etch through the silicide 225 into the device or the gate 209. The silicide region 225 which covers the gate sidewall exposed by the recess etching may, in some embodiments, help to prevent the preferential attacking of the spacers 219 and the LDD oxide 213. Hence, after the local interconnect etch or contact etch is performed, the profile of the spacers 219 remains intact.

The remaining processing steps used to complete the device are well known in the art. Typically, these steps involve the deposition of a conductive material within the opening 229 that has been etched in the preceding step. The conductive material may be, for example, tungsten or a suitable alloy such as TiW. The conductive material serves as a local interconnect and, in this particular example, contacts both the silicide region 225 of the gate 209 and the silicide region 225 which is in electrical contact with the active layer 207 (and the implant regions 221 defined therein, which serve as the source and drain regions of the transistor). Thus, the process results in a semiconductor structure that includes a gate 209 equipped with spacer structures 219 and silicide regions 225 that are present on the gate 209 and on the active layer 207. The portion of the silicide region 225 disposed on the gate 209 is in contact with both the top surface of the gate 209 and a portion of the sides of the gate 209.

Figure 14:
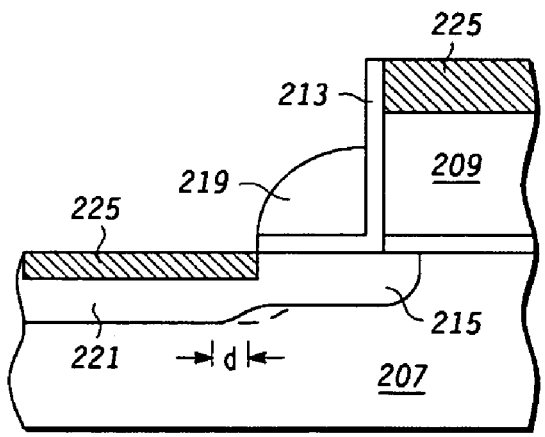
FIG. 14 is a close up view of the semiconductor structure of FIG. 13 which illustrates the effect that a two-etch process of the type disclosed herein has on the position of the implant regions in a CMOS device.

The effect of the process described herein on the placement and profile of the shallow and deep implant regions (regions 215 and 221, respectively) may be appreciated with respect to FIG. 14, which shows an enlarged portion of the device depicted in FIG. 13. The dashed line indicates the placement of the implant regions 215 and 221 that would be achieved if these regions were aligned to the final dimensions of the spacers 219 achieved after all of the recess etches are completed. As seen therein, absent the use of the process described herein for decoupling the spacer dimensions from the location of these implant regions 215 and 221, these regions would be shifted closer to each other by a distance d. Hence, the additional surface area of the gate 209 gained by the second recess etch in the process described herein permits an associated reduction in gate length, without causing voiding in the silicide layer and without sacrificing device performance.

One skilled in the art will appreciate that various other process steps may be added to the process described herein without departing from the present teachings. For example, each of the first and second recess etches may include various pre-etch and post-etch cleaning steps, as well as post-etch metrology steps. Moreover, the second recess etch (and any subsequent recess etches) may be employed at any desirable point in the process, though it will typically be performed sometime after the first recess etch and prior to any silicide pre-clean steps.

The recess etch process described herein also affords a number of advantages beyond those discussed above. In particular, the partitioning of the recess etch into at least first and second recess etches creates opportunities for process integration optimization in addition to the reductions in gate length and improved silicide layer stability that have been noted. Thus, for example, by inserting the second recess etch into the process prior to the silicide pre-clean step, and by minimizing the duration of the (typically HF) pre-clean, a reduction in silicide stringer formation may be achieved.

Moreover, the recess etches described herein can be utilized to minimize the impact of uneven removal during spacer formation of spacer material along the (typically polysilicon) sidewall of the gate due to line edge roughness. In particular, if the same anisotropic etch used to define the spacer structures is also used to create the recess in the spacer structures, line edge roughness will contribute to uneven removal of the spacer material at the spacer structure/gate interface. By contrast, a combination of: (1) appropriate positioning of the individual recess etch steps within the process flow and (2) interposition of suitable isotropic wet or dry cleans between the individual recess steps in the process described herein can be used to compensate for this problem, thus reducing or eliminating the uneven removal of this material.

As a further advantage, the process described herein permits the insertion of the second recess etch between the N and P source/drain implants in the formation of CMOS transistors. With the use of suitable masking techniques, this approach can be used to separately optimize the spacer widths of the NMOS and PMOS devices, thereby optimizing the performance of both transistor types independently.

As another advantage, the use of a multi-step recess etch offers greater process and process integration flexibility than the type of spacer overetch process described in FIGS. 1-5. Thus, for example, this approach allows for the selective creation of different recesses and different spacer widths for different device classes. It also offers the ability to minimize liner oxide loss through the optimization of recess etch selectivity, and the integration of additional etch chemistries into the process which, while ideal for use as a recess etch, might not be optimal for initial spacer formation.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a silicided gate structure, comprising:
   providing a semiconductor substrate having a gate disposed thereon and having a spacer disposed adjacent to the gate;
   subjecting the spacer to a first etch which exposes a first lateral portion of the gate;
   creating an implant region adjacent to the spacer after the first etch;
   subjecting the spacer to a second etch which exposes a second lateral portion of the gate; and
   forming a layer of silicide over the first and second lateral portions of the gate.

2. The method of claim 1, wherein the layer of silicide also extends over a portion of the substrate adjacent to the spacer structure.

3. The method of claim 1, wherein the layer of silicide is formed by depositing a conformal layer of a refractory metal such that the conformal layer is in contact with the first and second lateral portions of the gate.

4. The method of claim 3, wherein the refractory metal is selected from the group consisting of Co, Ti, Ni, W, Pt and Pd.

5. The method of claim 1, wherein the layer of silicide comprises a material selected from the group consisting of cobalt silicide, titanium silicide, nickel silicide, tungsten silicide, platinum silicide and palladium silicide.

6. The method of claim 1, wherein the gate has a dielectric layer disposed thereon which separates the spacer from the gate, and wherein the second etch removes any exposed portion of the dielectric layer.

7. The method of claim 6, wherein the step of creating an implant region adjacent to the spacer involves implanting a dopant into a substrate adjacent to the spacer, and wherein the implantation is aligned with the spacer.

8. The method of claim 7, wherein the device has first and second implant regions in the substrate, wherein the second implant region is formed by an implantation that is aligned with the spacer prior to the second etch, and wherein the first implant region is formed by an implantation that is aligned with the gate.

9. The method of claim 8, wherein the second implantation is not aligned with the spacer after the second etch.

10. The method of claim 8, wherein the second etch reduces the width of the spacer.

11. The method of claim 8, wherein said first and second implant regions form the source and drain regions of a transistor.

12. The method of claim 8, wherein the first and second implant regions are each formed by implantation of a dopant followed by diffusion.

13. The method of claim 1, wherein the first etch is selective to the material of the spacer.

14. The method of claim 13, wherein a dielectric layer is disposed between the spacer and the gate electrode, and wherein the first etch also etches the dielectric layer.

15. The method of claim 1 wherein, prior to the first etch, the spacer covers the entire side of the electrode.

16. A method for making a silicided gate structure, comprising:
    providing a semiconductor substrate having a gate disposed thereon;
    depositing a conformal layer of spacer material over the gate;
    etching the conformal layer to define first and second spacer structures therein, wherein the first and second spacer structures are adjacent to the gate;
    subjecting the structure to a second etch which exposes a first lateral portion of the gate;
    creating first and second implant regions adjacent to the first and second spacers after the second etch;
    subjecting the structure to a third etch which exposes a second lateral portion of the gate; and
    forming a layer of silicide over the first and second lateral portions of the gate.

17. The method of claim 16, wherein the layer of silicide also extends over a portion of the substrate adjacent to the first and second spacer structures.

18. The method of claim 16, wherein the layer of silicide is formed by depositing a conformal layer of a refractory metal such that the conformal layer is in contact with the first and second lateral portions of the gate.

19. The method of claim 18, wherein the refractory metal is selected from the group consisting of Co, Ti, Ni, W, Pt and Pd.

20. The method of claim 16, wherein the layer of silicide comprises cobalt silicide, titanium silicide, nickel silicide, tungsten silicide, platinum silicide and palladium silicide.

21. A method for making a silicided gate structure, comprising:
    providing a semiconductor substrate having a gate disposed thereon and having a spacer disposed adjacent to the gate;
    subjecting the spacer to a first etch which exposes a first portion of the sidewall of the gate;
    creating an implant region adjacent to the spacer after the first etch;
    subjecting the spacer to a second etch which exposes a second portion of the sidewall of the gate; and
    forming a layer of silicide over the first and second portions of the gate.

* * * * *